United States Patent
Li et al.

(10) Patent No.: US 10,608,333 B2
(45) Date of Patent: Mar. 31, 2020

(54) NON-METAL PNEUMATIC CYLINDER FOR USE IN ELECTROMAGNETIC COMPATIBILITY TEST, ANTENNA DEVICE HAVING ADAPTABLE ANGLE OF ROTATION, AND SYSTEM

(71) Applicant: GUANGZHOU CHANGEN ELECTRONIC TECHNOLOGY CO., LTD, Guangdong (CN)

(72) Inventors: Nan Li, Guangdong (CN); Jun Li, Guangdong (CN)

(73) Assignee: GUANGZHOU CHANGEN ELECTRONIC TECHNOLOGY CO., LTD, Guangdong (CN)

( * ) Notice: Subject to any disclaimer, the term of this patent is extended or adjusted under 35 U.S.C. 154(b) by 20 days.

(21) Appl. No.: 16/067,823

(22) PCT Filed: Dec. 30, 2016

(86) PCT No.: PCT/CN2016/113876
§ 371 (c)(1),
(2) Date: Jul. 3, 2018

(87) PCT Pub. No.: WO2017/118358
PCT Pub. Date: Jul. 13, 2017

(65) Prior Publication Data
US 2019/0006750 A1    Jan. 3, 2019

(30) Foreign Application Priority Data

Jan. 4, 2016 (CN) .......................... 2016 1 0009807

(51) Int. Cl.
*H01Q 3/08* (2006.01)
*H01Q 1/12* (2006.01)
(Continued)

(52) U.S. Cl.
CPC ............... *H01Q 3/08* (2013.01); *F15B 15/06* (2013.01); *F15B 15/1428* (2013.01);
(Continued)

(58) Field of Classification Search
CPC .......... H01Q 3/08; H01Q 1/10; H01Q 1/1235; F15B 15/06; F15B 15/1428; F15B 15/28; G01R 1/04; G01R 31/001
See application file for complete search history.

(56) References Cited

U.S. PATENT DOCUMENTS

| 5,009,115 A | 4/1991 | Ringot et al. |
| 8,362,788 B2 * | 1/2013 | Trummer ............ F15B 15/2869 324/642 |
| 2019/0025359 A1 * | 1/2019 | Li ............................ H01Q 1/22 |

FOREIGN PATENT DOCUMENTS

| CN | 1563728 A | 1/2005 |
| CN | 201528046 | 7/2010 |

(Continued)

OTHER PUBLICATIONS

State Intellectual Property Office of the P.R. China; China; Mar. 17, 2017.

*Primary Examiner* — Dameon E Levi
*Assistant Examiner* — David E Lotter
(74) *Attorney, Agent, or Firm* — Patshegen IP LLC; Moshe Pinchas

(57) ABSTRACT

Provided are a non-metallic cylinder for electromagnetic compatibility testing, a rotary angle adjustable antenna device, and a rotary angle adjustable antenna system. The rotary angle adjustable antenna device provided by the present disclosure includes a non-metallic cylinder, a first adapting piece, and an antenna; the antenna is mounted in the first mounting hole with a rotary sleeve arranged outside, at least one end of the antenna extends out of the first mounting hole; the first adapting piece is further provided (Continued)

with a second mounting hole, the first piston rod of the non-metallic cylinder is placed in the empty slot of the first adapting piece after passing through the end cover of the non-metallic cylinder then passing through the second mounting hole of the first adapting piece; the first piston rod of the non-metallic cylinder is connected with the rotary sleeve.

8 Claims, 4 Drawing Sheets

(51) Int. Cl.
*H01Q 3/06* (2006.01)
*G01R 29/08* (2006.01)
*F15B 15/06* (2006.01)
*F15B 15/14* (2006.01)
*F15B 15/28* (2006.01)
*H01Q 1/10* (2006.01)
*H01Q 1/22* (2006.01)
*G01R 1/04* (2006.01)
*G01R 31/00* (2006.01)

(52) U.S. Cl.
CPC .......... *F15B 15/1461* (2013.01); *F15B 15/28* (2013.01); *G01R 29/0878* (2013.01); *H01Q 1/10* (2013.01); *H01Q 1/125* (2013.01); *H01Q 1/1235* (2013.01); *H01Q 1/1264* (2013.01); *H01Q 3/06* (2013.01); *F15B 15/1423* (2013.01); *F15B 2215/305* (2013.01); *G01R 1/04* (2013.01); *G01R 31/001* (2013.01); *H01Q 1/22* (2013.01)

(56) References Cited

FOREIGN PATENT DOCUMENTS

| | | |
|---|---|---|
| CN | 201627774 | 11/2010 |
| CN | 202308269 A | 7/2012 |
| CN | 105485084 | 4/2016 |
| CN | 205388061 R | 7/2016 |
| SE | 8104226 A | 2/1983 |

* cited by examiner

NON-METAL PNEUMATIC CYLINDER FOR USE IN ELECTROMAGNETIC COMPATIBILITY TEST, ANTENNA DEVICE HAVING ADAPTABLE ANGLE OF ROTATION, AND SYSTEM

CROSS-REFERENCE TO RELATED APPLICATIONS

This application claims the benefit of priority to Chinese Patent Application No. 201610009807.0, filed on Jan. 4, 2016, and entitled "NON-METALLIC CYLINDER FOR ELECTROMAGNETIC COMPATIBILITY TESTING, ROTARY ANGLE ADJUSTABLE ANTENNA DEVICE AND SYSTEM", which disclosures are herein incorporated by reference.

TECHNICAL FIELD

The present disclosure relates to corollary equipment for electromagnetic compatibility testing and particularly to a non-metallic cylinder for electromagnetic compatibility testing, a rotary angle adjustable antenna device, and a rotary angle adjustable antenna system.

BACKGROUND

When conducting electromagnetic compatibility testing by using a wide test site or an anechoic chamber, an antenna needs to be lift or rotated to change an angle of the antenna; however, frequently-used antenna drive equipment is motor-driven at present, a motor will generate large electromagnetic disturbance outwards in the test, which will disturb the receive and dispatch of test signal of the antenna, so as to affect the result of electromagnetic compatibility testing of the products.

SUMMARY

To address the deficiency of the existing technology, the present disclosure provides a non-metallic cylinder for electromagnetic compatibility testing, a rotary angle adjustable antenna device, and a rotary angle adjustable antenna system.

A first aspect of the present disclosure provides a non-metallic cylinder for electromagnetic compatibility testing, which comprises: a first cylinder body, an end cover, a piston placed in the first cylinder body and dividing the first cylinder body into a first chamber and a second chamber, a first through hole provided on the wall of the first cylinder body and communicating with the first chamber, a second through hole provided on the wall of the first cylinder body and communicating with the second chamber, and a piston rod; wherein, a first end of the piston rod is fixedly connected with the piston, a second end of the piston rod passes through a third through hole formed on the end cover and exposes outside the first cylinder body.

According to an implementation of the present disclosure, the first through hole and the second through hole are respectively connected to an air pressure control device through a pipeline, the air pressure control device controls the air flow direction of the first through hole and the second through hole by controlling air inlet and outlet valves, and then controls the direction and speed of telescopic movement of the first piston rod.

When an airflow enters the interior of the first chamber along the first through hole, the airflow pushes the piston, and drives the piston rod to move toward the second chamber, and the first through hole exhausts. Conversely, if the airflow enters the interior of the second chamber along the second through hole, the airflow pushes the piston and drives the piston rod to move toward the first chamber, and the first through hole exhausts.

According to an implementation of the present disclosure, a first annular sealing element is provided at a portion where the piston is coupled with the first cylinder body; a second annular sealing element is provided at a portion where the first cylinder body is coupled with the piston rod; and a third annular sealing element is provided at a portion where the end cover is coupled with the piston rod.

Each components of the non-metallic cylinder are all non-metallic materials, commonly, such as polytetrafluoroethylene, which prevent interference to electromagnetic compatibility testing.

A second aspect of the present disclosure provides a rotary angle adjustable antenna device, which comprises a non-metallic cylinder for electromagnetic compatibility testing, a first adapting piece, and an antenna; wherein, the adapting piece comprises: a hollow cavity, an empty slot arranged inside the cavity, a first mounting hole arranged inside the cavity and penetrating upper and lower surfaces of the adapting piece, and a second mounting hole communicated with the empty slot;

the antenna is mounted in the first mounting hole with a rotary sleeve arranged outside, at least one end of the antenna extends out of the first mounting hole;

the non-metallic cylinder for electromagnetic compatibility testing comprises: a first cylinder body, an end cover, a first piston placed in the first cylinder body and dividing the first cylinder body into a first chamber and a second chamber, a first through hole provided on the wall of the first cylinder body and communicating with the first chamber, a second through hole provided on the wall of the first cylinder body and communicating with the second chamber, and a first piston rod; wherein, a first end of the piston rod is fixedly connected with the piston, a second end of the piston rod passes through a third through hole formed on the end cover and exposes outside the first cylinder body;

the first adapting piece is further provided with a second mounting hole, the piston rod of the non-metallic cylinder is placed in the empty slot of the first adapting piece after passing through the end cover of the non-metallic cylinder then passing through the second mounting hole of the first adapting piece; the first piston rod is connected with the rotary sleeve, wherein the first piston rod can drive the rotary sleeve to rotate in the range of 0-90° when telescopically moving back and forth along the empty slot, and then driving the antenna to rotate in the range of 0-90°.

According to an implementation of the present disclosure, the first through hole and the second through hole are respectively connected to an air pressure control device through a pipeline, the air pressure control device controls the air flow direction of the first through hole and the second through hole by controlling air inlet and outlet valves, and then controls the direction and speed of telescopic movement of the first piston rod.

When an airflow enters the interior of the first chamber along the first through hole, the airflow pushes the piston, and drives the piston rod to move toward the second chamber, and the first through hole exhausts. Conversely, if the airflow enters the interior of the second chamber along the second through hole, the airflow pushes the piston and drives the piston rod to move toward the first chamber, and the first through hole exhausts.

According to an implementation of the present disclosure, a first annular sealing element is provided at a portion where the piston of the non-metallic cylinder is coupled with the first cylinder body; a second annular sealing element is provided at a portion where the first cylinder body is coupled with the piston rod; and a third annular sealing element is provided at a portion where the end cover is coupled with the piston rod.

According to an implementation of the present disclosure, one side of the adapting piece with the second mounting hole is provided with a mounting screw hole, the end cover of the non-metallic cylinder is provided with a matching mounting screw hole, and the end cover of the non-metallic cylinder is screw joint with the side of the first adapting piece with the second mounting hole through a screw.

According to an implementation of the present disclosure, the rotary angle adjustable antenna device further comprises an antenna mount, a connecting arm connected to the antenna mount, a second adapting piece fixedly connected to the connecting arm, and a non-metallic position sensor fixedly connected to the connecting arm; wherein, the first adapting piece is movably connected on the second adapting piece; the first adapting piece and the second adapting piece are connected through a step-type connecting shaft, and the step-type connecting shaft is further connected with the non-metallic position sensor.

Furthermore, the step-type connecting shaft being further connected with the non-metallic position sensor comprises: the non-metallic position sensor comprising a second cylinder body, a second piston and a second piston rod placed in the second cylinder body, one end of the second piston being fixedly connected with the second piston rod, another end of the second piston being fixedly connected with a connecting rod; wherein the step-type connecting shaft drives the connecting rod of the non-metallic position sensor to perform telescopic movement through a transmission connecting part.

A third aspect of the present disclosure provides a rotary angle adjustable antenna system, which comprises a rotary angle adjustable antenna device of the second aspect of the present disclosure, wherein the system further comprises a first gas delivery device connected with the non-metallic cylinder of the rotary angle adjustable antenna device, a gas delivery control device connected with the first gas delivery device, and the gas delivery control device is configured to: send a first gas delivery instruction or a second gas delivery instruction to the first gas delivery device; the first gas delivery device is configured to: when receiving the first gas delivery instruction sent by the gas delivery control device, supply gas to the first through hole of the non-metallic cylinder, so that the first piston rod advances toward the second through hole; and when receiving the second gas delivery instruction sent by the gas delivery control device, supply gas to the second through hole of the non-metallic cylinder, so that the first piston rod advances toward the first through hole.

According to an implementation of the present disclosure, the gas delivery control device is configured to control the direction and volume of air flow supplied by the first gas delivery device to the first through hole and/or the second through hole of the non-metallic cylinder, thereby control the direction and speed of telescopic movement of the first piston rod.

A fourth aspect of the present disclosure provides applications of the non-metallic cylinder described in the first aspect, the rotary angle adjustable antenna device described in the second aspect, and the rotary angle adjustable antenna system described in the first aspect in electromagnetic compatibility testing.

Advantageous effects are provided by the present disclosure, that is: the non-metallic cylinder for electromagnetic compatibility testing, the rotary angle adjustable antenna device, and the rotary angle adjustable antenna system provided by the present disclosure, not only have simple working principle, convenient operation, and high reliability, but also can realize the positioning of the antenna in a multidimensional space by controlling a horizontal pitch angle and a rotation angle of the antenna.

DETAILED DESCRIPTION OF ILLUSTRATED EMBODIMENTS

Figure 1:
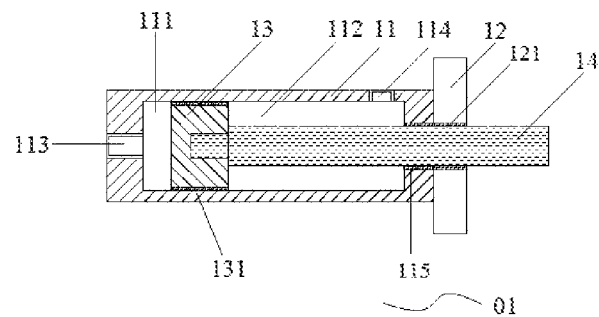
FIG. 1 is a sectional view illustrating a non-metallic cylinder 01 for electromagnetic compatibility testing according to an embodiment of the present disclosure.

The following further describes the present disclosure with reference to the accompanying drawings and specific embodiments, the illustrative embodiments and descriptions therein are only used to explain the present disclosure, but are not intended to limit the present disclosure.

What should be noted is, in the disclosure, the technical words "first", "second" are only be used for a descriptive purpose, and are not to be understood to indicate or imply the relative importance or imply the number of the indicated technical features. Therefore, features defined with "first", "second" may include one or more of the features explicitly or implicitly. In the description of the disclosure, "multiple" means two or more than two, unless specifically defined otherwise.

In the disclosure, the technical words "the first position", "the second position" should be understood in generalization. For example, it could be a location point, or an activity area.

In the disclosure, the technical words "move down", "move up", "rise" or "decline" et al. should be understood in generalization. For example, the first feature "moves down", "moves up", "rises" or "declines" relative to the second feature could represents the first feature moves in the direction of the first position of the second feature relative to the second feature, or the first feature moves in the direction of the second position of the second feature relative to the second feature.

In the disclosure, the technical words "load", "install", "be linked to", "connect to", "fix" et al. should be understood in generalization, unless specifically defined otherwise. For example, these technical words are described as fixed joint or removable connection or the integration of the connection; or mechanical joint or electrical connection; or direct connection or indirect connection via the middle medium or internal connection between the two components. The skilled persons in the art can understand the specific meaning about these technical words in the disclosure according to the specific circumstance.

In the disclosure, unless specifically defined otherwise, the first feature being located on the second feature or under the second feature could disclose the direct connection between the first feature and the second feature, and could also disclose that the first feature is not directly connected to the second feature but adopts other ways to connect to the second feature. Furthermore, the first feature being located "above" and "on" the second feature means that the first feature is located right above the second feature or above the second feature, or only means that the horizontal height of the first feature is higher than that of the second feature. Also the first feature being located "under" and "below" the second feature means that the first feature is located right under the second feature or under the second feature, or only means that the horizontal height of the first feature is lower than that of the second feature.

Embodiment One a Non-Metallic Cylinder for Electromagnetic Compatibility Testing FIG. 1 is a sectional view illustrating a non-metallic cylinder 01 for electromagnetic compatibility testing according to an embodiment of the present disclosure.

As shown in FIG. 1, a non-metallic cylinder 01 for electromagnetic compatibility testing provided by the present disclosure, which comprises: a first cylinder body 11, an end cover 12, a piston 13 placed in the first cylinder body 11 and dividing the first cylinder body 11 into a first chamber 111 and a second chamber 112, a first through hole 113 provided on the wall of the first cylinder body 11 and communicating with the first chamber 111, a second through hole 114 provided on the wall of the first cylinder body 11 and communicating with the second chamber 112, and a first piston rod 14; wherein, a first end of the piston rod 14 is fixedly connected with the piston 13, a second end of the piston rod passes through a third through hole (not shown in FIG. 1) formed on the end cover 12 and exposes outside the first cylinder body 11.

According to an implementation of the present disclosure, the first through hole 113 and the second through hole 114 are respectively connected to an air pressure control device through a pipeline, the air pressure control device controls the air flow direction of the first through hole 113 and the second through hole 114 by controlling air inlet and outlet valves, and then controls the direction and speed of telescopic movement of the first piston rod 14.

When the first through hole 113 is an air inlet hole, the second through hole 114 is an air outlet hole; conversely, when the first through hole 113 is an air outlet hole, the second through hole 114 is an air inlet hole. When an airflow enters the interior of the first chamber 111 along the first through hole 113, the airflow pushes the piston 13, and drives the first piston rod 14 to move toward the second chamber 112, and the first through hole 114 exhausts. Conversely, if the airflow enters the interior of the second chamber 112 along the second through hole 114, the airflow pushes the piston 13 and drives the first piston rod 14 to move toward the first chamber 111, and the first through hole 113 exhausts.

According to a second implementation of the present disclosure, a first annular sealing element 131 is provided at a portion where the piston 13 is coupled with the first cylinder body 11; a second annular sealing element 115 is provided at a portion where the first cylinder body 11 is coupled with the piston rod 14; and a third annular sealing element 121 is provided at a portion where the end cover 12 is coupled with the piston rod 14.

The first annular sealing element 131, the second annular sealing element 115, and the third annular sealing element 121 are all non-metallic seal rings, such as rubber soft rings. The annular sealing elements can prevent an air leakage at the portion where the piston is coupled with the cylinder body, the portion where the cylinder body is coupled with the piston rod, and the portion where the end cover is coupled with the piston rod, that is, playing the role of sealing.

Each components of the cylinder 01 are all non-metallic materials, commonly, such as polyoxymethylene and polytetrafluoroethylene, which prevent interference to electromagnetic compatibility testing.

Embodiment Two a Rotary Angle Adjustable Antenna Device

Figure 2:
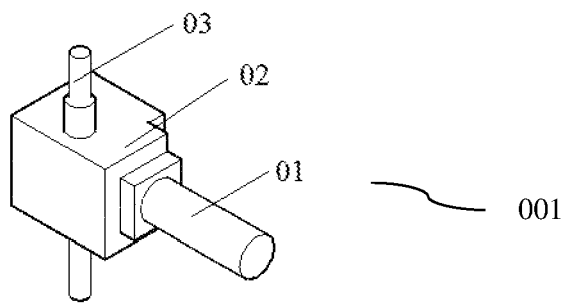
FIG. 2 is a schematic structural diagram illustrating a rotary angle adjustable antenna device 001 according to an embodiment of the present disclosure.
Figure 3:
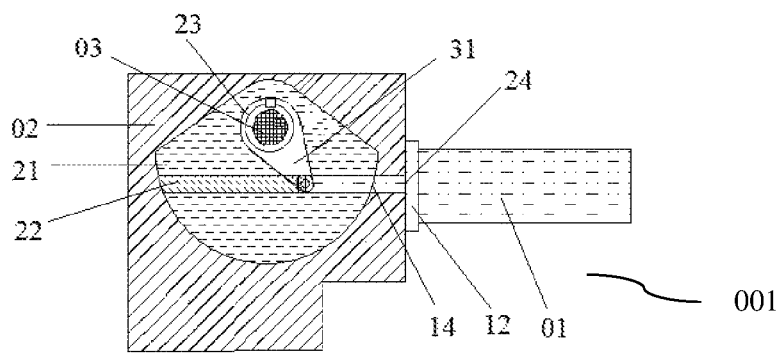
FIG. 3 is a sectional view illustrating the rotary angle adjustable antenna device 001 according to an embodiment of the present disclosure.

FIG. 2 is a schematic structural diagram illustrating a rotary angle adjustable antenna device 001 according to an embodiment of the present disclosure; FIG. 3 is a sectional view illustrating the rotary angle adjustable antenna device 001 according to an embodiment of the present disclosure.

As shown in FIG. 2 and FIG. 3, the rotary angle adjustable antenna device 001 provided by the second embodiment of the present disclosure comprises a non-metallic cylinder 01 for electromagnetic compatibility testing provided by the present disclosure, a adapting piece 02, and an antenna 03; wherein, the adapting piece 02 comprises: a hollow cavity 21, an empty slot 22 arranged inside the cavity 21, a first mounting hole 23 arranged inside the cavity 21 and penetrating upper and lower surfaces of the adapting piece 02, and a second mounting hole 24 communicated with the empty slot 22;

the antenna 03 is mounted in the first mounting hole 23 with a rotary sleeve 31 arranged outside, at least one end of the antenna 03 extends out of the first mounting hole 23.

According to a third implementation of the present disclosure, one side of the adapting piece 02 with the second mounting hole 24 is provided with a mounting screw hole (not shown in FIG. 3), the end cover 12 of the non-metallic cylinder 01 is provided with a matching mounting screw hole, and the end cover 12 of the non-metallic cylinder 01 is screw joint with the side of the adapting piece 02 with the second mounting hole 24 through a screw.

According to a fourth implementation of the present disclosure, the piston rod 14 of the non-metallic cylinder 01 is placed in the empty slot 22 of the adapting piece 02 after passing through the end cover 12 then passing through the second mounting hole 24 of the adapting piece 02; the first piston rod 14 is connected with the rotary sleeve 31, wherein the first piston rod 14 can drive the rotary sleeve 31 to rotate in the range of 0-90° when telescopically moving back and forth along the empty slot 22, and then driving the antenna 03 to rotate in the range of 0-90°.

According to a fifth implementation of the present disclosure, a rotary angle adjustable antenna device 001 further comprises a cylinder control module, the cylinder control module is configured to control the direction and volume of air flow which enters the first through hole 113 or the second through hole 114 of the non-metallic cylinder 01, and then drive the first piston rod 14 to move telescopically back and forth along the empty slot 22.

The rotary angle adjustable antenna device 001 of the present disclosure links the rotation of the antenna 03 and the advancement and ejection of the first piston rod 14 through the action of the cylinder; thus, the antenna can rotate in the range of 0-90°.

In this specific implementation, the rotary angle adjustable antenna device 001 further comprises a cylinder control module, the cylinder control module is configured to control the direction and volume of air flow which enters the first through hole 113 or the second through hole 114, and then controls the direction and speed of telescopic movement of the first piston rod, so that the first piston rod 14 of the non-metallic cylinder 01 can drive the rotary sleeve to rotate in the range of 0-90°, and then drive the antenna to rotate in the range of 0-90°.

Embodiment Three a Rotary Angle Adjustable Antenna Device

Figure 4:
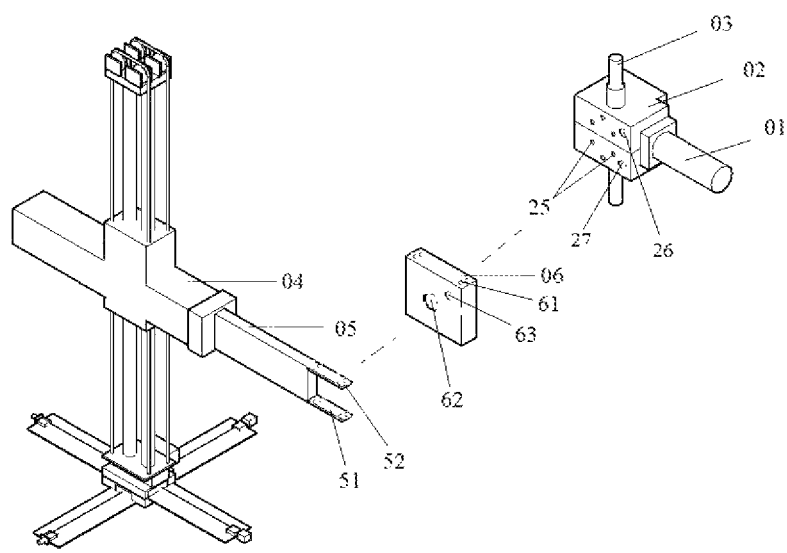
FIG. 4 is a schematic structural diagram illustrating a rotary angle adjustable antenna device 002 according to an embodiment of the present disclosure.
Figure 5:
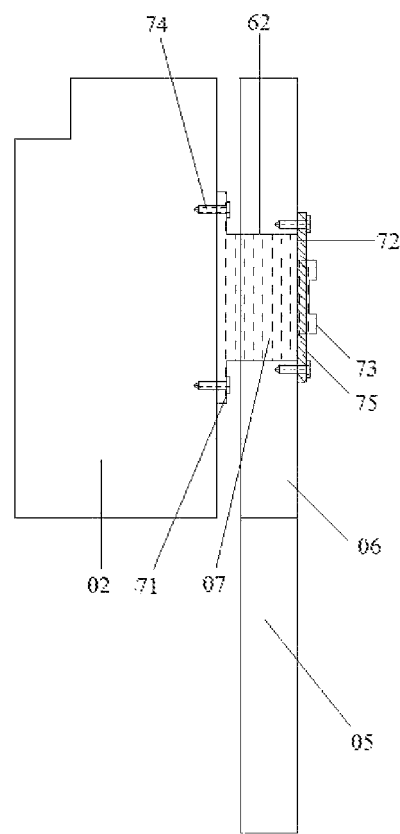
FIG. 5 is a schematic connection diagram of a first adapting piece 02 and a second adapting piece 06 according to an embodiment of the present disclosure.
Figure 6:
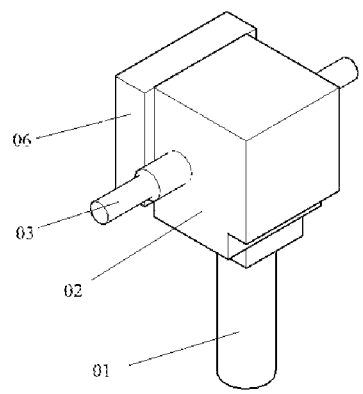
FIG. 6 is a schematic diagram illustrating an antenna 03 of a rotary angle adjustable antenna device being placed horizontally according to an embodiment of the present disclosure.

FIG. 4 is a schematic structural diagram illustrating a rotary angle adjustable antenna device 002 according to the third embodiment of the present disclosure; FIG. 5 is a schematic connection diagram of a first adapting piece 02 and a second adapting piece 06 according to an embodiment of the present disclosure; FIG. 6 is a schematic diagram illustrating an antenna 03 of a rotary angle adjustable antenna device being placed horizontally according to an embodiment of the present disclosure.

As shown in FIG. 4, the rotary angle adjustable antenna device 002 provided by the third embodiment of the present disclosure comprises a non-metallic cylinder 01 for electromagnetic compatibility testing provided by the present disclosure, a first adapting piece 02, and an antenna 03, the rotary angle adjustable antenna device 002 further comprises an antenna mount 04, a connecting arm 05 connected to the antenna mount 04, a second adapting piece 06 fixedly connected to the connecting arm 05; wherein the first adapting piece 02 is movably connected on the second adapting piece 06.

In a fifth implementation of the present disclosure, an end of the connecting arm 05 is fixedly connected to the antenna mount 04, another end of the connecting arm 05 is provided with a "⊏" shaped groove, upper and lower ends of the groove are provided with mounting holes; both the upper end and the lower end of the second adapting piece 06 are provided with a plurality of mounting holes 61 matching with the upper and lower mounting holes of the connecting arm 05; the second adapting piece 06 is installed in the "⊏" shaped groove of the connecting arm 05, and mounting holes of an upper arm 51 and a lower arm 52 of the connecting arm 05 are detachably connected with the mounting hole 61 of the second adapting piece 06 through a bolt or a screw.

In this specific implementation, a specific structure that one end of the connecting arm 05 is fixedly connected on the antenna mount 04 is: the antenna mount 04 includes an column and an elevating seat that is sleeved on the column and can move up and down along the column; and one end of the connecting arm 05 is fixedly connected on the elevating seat on the column of the antenna mount 04, and the connecting arm 05 can move up and down with the elevating seat.

In a sixth implementation of the present disclosure, as shown in FIG. 5, the first adapting piece 02 is connected with the second adapting piece 06 through a step-type connecting shaft 07.

In this specific implementation, a side wall of the second adapting piece 06 is provided with a first mounting hole 62 and a first positioning hole 63 (both the first mounting hole 62 and the first positioning hole 63 are through holes, that is, the first mounting hole 62 and the first positioning hole 63 passing through the both side sidewalls of the second adapting piece 06); a side wall of the first adapting piece 02 is provided with a second mounting hole 25, a horizontal positioning hole 26, and a vertical positioning hole 27; wherein one end of the step-type connecting shaft 07 is fixed on the side wall which has the second mounting hole 25 of first adapting piece 02, another end of the step-type connecting shaft 07 passes through the first mounting hole 62 of the second adapting piece 06, and the step-type connecting shaft 07 is rotatable in the first mounting hole 62; the first positioning hole 63 of the second adapting piece 06 and the horizontal positioning hole 26 or the vertical positioning hole 27 of the first adapting piece 02 are detachably connected by a bolt or a screw.

In this specific implementation, the step-type connecting shaft 07 includes: a first step 71, a second step 72 connected with the first step 71 and passing through the first mounting hole 62, and a third step 73 connected with the second step 72, wherein the first step 71 is connected with a side wall with the second mounting hole 25 of the first adapting piece 02 by a screw 74; the second step 72 penetrates the first mounting hole 62, the third step 73 passes through the first mounting hole 62, and the step-type connecting shaft 07 can rotationally move in the first mounting hole 62.

In this specific implementation, the step-type connecting shaft 07 further includes a dead plate 75, the dead plate 75 is sleeved on the third step 73, the dead plate 75 is connected with the connecting arm 05 through a screw 74, which makes the device more firm.

In this specific implementation, when a technician connects the first positioning hole 63 with the horizontal positioning hole 26 or the vertical positioning hole 27 through a bolt or a screw, the first adapting piece 02 is rotated 0 or 90°, so as to make the antenna 03 sleeved on the first adapting piece 02 to rotate along with the first adapting piece 02 by 0 or 90°, that is, making the antenna 03 to have different position states of being placed vertically or horizontally.

It can be understood that, because the second adapting piece 06 is fixed on the connecting arm 05, the second adapting piece 06 and the first adapting piece 02 are movably connected through the step-type connecting shaft 07, the technician only need to connect the first positioning hole 63 of the second adapting piece 06 with the horizontal positioning hole 26 or the vertical positioning hole 27 of the first adapting piece 02 to realize the change of different orientations of the first adapting piece 02, that is, changing the state of the plug or the screw inserted in the horizontal positioning hole 27 or the vertical positioning hole 26 to change the position state of the first adapting piece 02, and then, driving the step-type connecting shaft 07 to rotate around the axis of the step-type connecting shaft 07 through the first adapting piece 02. As shown in FIG. 4, in this state, the antenna 03 on the first adapting piece 02 is placed horizontally; if changing the inserting position of the bolt or the screw, the antenna 03 on the first adapting piece 02 can be placed vertically (that is, the location of the non-metallic cylinder 01 in FIG. 6).

Figure 7:
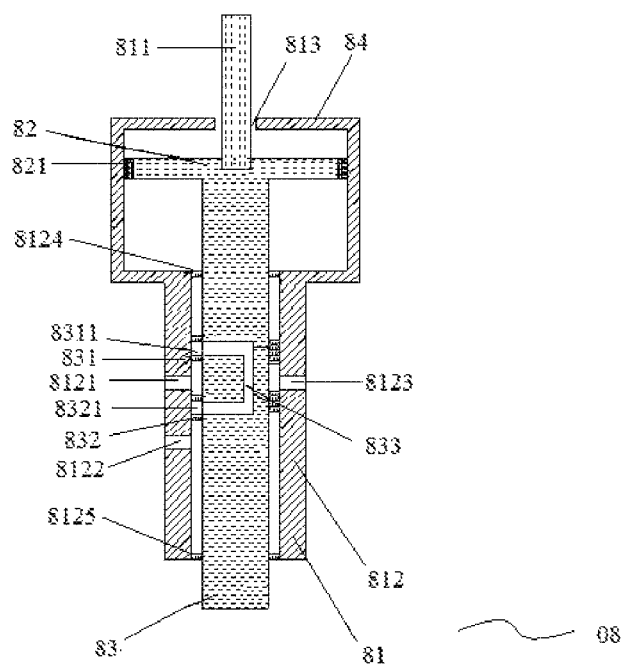
FIG. 7 is a schematic structural diagram illustrating a non-metallic position sensor 08 of state 1 according to an embodiment of the present disclosure.

In a seventh implementation of the present disclosure, FIG. 7 is a sectional view illustrating a non-metallic position sensor 08; the rotary angle adjustable antenna device 002 provided by the third embodiment of the present disclosure further comprises a non-metallic position sensor 08, the step-type connecting shaft 07 is further connected with the non-metallic position sensor 08; wherein, the non-metallic position sensor 08 further comprises:

a second cylinder body 81, a second piston 82 placed in the second cylinder body 81, and a second piston rod 83 whose one end is fixedly connected with the second piston 82; the second cylinder body 81 includes a second cylinder body upper chamber 811 and a second cylinder body lower chamber 812; a side wall of the second cylinder body lower chamber 812 is provided with a first radial air hole 8121, a second radial air hole 8122 arranged on the lower end of the first radial air hole 8121, and a third radial air hole 8123 arranged axially symmetrically with the first radial air hole 8121;

a portion of the second piston rod 83 combined with the inner wall of the second cylinder body lower chamber 812 is provided with a first seal ring 831 and a second seal ring 832 in sequence from top to bottom, and the second piston rod 83 is provided with an I-shaped breather pipe 833 internally; an axial distance between the first seal ring 831 and the second seal ring 832 is equal to an axial distance between the first radial air hole 8121 and the second radial air hole 8122; the first seal ring 831, the second seal ring 832, and the inner chamber of the second cylinder body lower chamber 812 are sealed and in clearance fit; and the first seal ring 831 is provided with a first radial through-hole 8311, the second seal ring 832 is provided with a second radial through-hole 8321;

The end of the second cylinder 81 of the non-metallic position sensor 08 is provided with an axial through hole 813 and a connecting rod 84 whose head end is fixed on the third piston 83, whose tail end passes through the axial through hole 813, and protruding from the second cylinder 81.

When the second piston rod 83 moves in the inner cavity of the second cylinder body 81 to a first position, the first radial air hole 8121 is communicated with the third radial air hole 8123; when the second piston rod 83 moves in the inner cavity of the second cylinder body 81 to a second position, the first radial air hole 8121 is communicated with the second radial air hole 8122 through the breather pipe 833.

In this specific implementation, the connecting rod 84 of the second non-metallic position sensor 08 is connected with the step-type connecting shaft 07 through the transmission connecting part; when the step-type connecting shaft 07 rotates around the axis of the step-type connecting shaft 07 under external force, (such as, a tester drives the step-type connecting shaft 07 to rotate around the axis of the step-type connecting shaft 07 through the first adapting piece), the step-type connecting shaft 07 can drive the connecting rod 84 to perform telescopic movement through the transmission connecting part.

Figure 8:
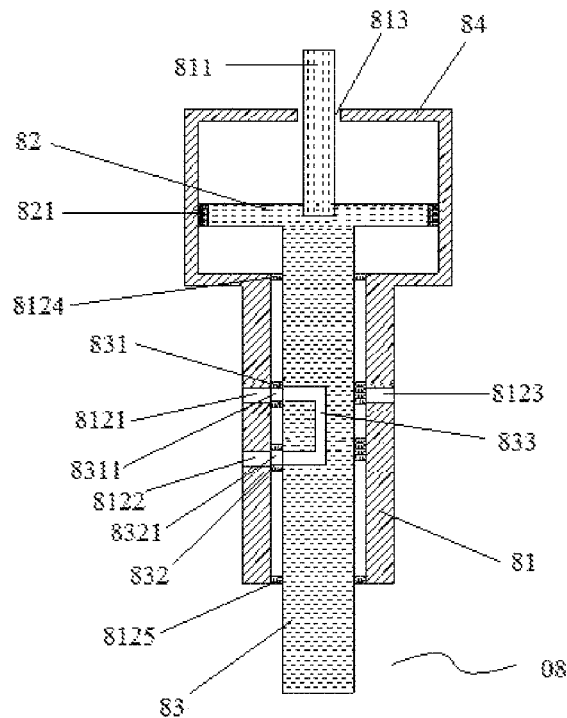
FIG. 8 is a schematic structural diagram illustrating a non-metallic position sensor 08 of state 1 according to an embodiment of the present disclosure.

It can be understood that, as shown in FIG. 7 of state 1, the second piston rod 83 moves in the inner cavity of the second cylinder body 81 to make the first radial air hole 8121 communicated with the third radial air hole 8123. As shown in FIG. 8 of state 2, the second piston rod 83 moves in the inner cavity of the second cylinder body 81 to make the first radial air hole 8121 communicated with the second radial air hole 8122 through the breather pipe 833.

Furthermore, one of the first radial air hole 8121 and the third radial air hole 8123 is an air inlet hole, and the other is an air outlet hole; wherein the air inlet hole is connected with an external air inlet device and the air outlet hole is connected with an external gas-electric conversion device.

Furthermore, the non-metallic position sensor 08 (the air outlet hole of the first radial air hole 8121 and the third radial air hole 8123) sends a first air pressure signal to the outside when the first radial air hole 8121 is communicated with the third radial air hole 8123.

Furthermore, one of the first radial air hole 8121 and the second radial air hole 8122 is an air inlet hole, and the other is an air outlet hole; wherein the air inlet hole is connected with an external air inlet device and the air outlet hole is connected with an external gas-electric conversion device.

Furthermore, when the first radial air hole 8121 is communicated with the second radial air hole 8122, the non-metallic position sensor 08 (the air outlet hole of the first radial air hole 8121 and the second radial air hole 8122) is configured to send a second air pressure signal to the outside.

In this specific implementation, a portion of the second piston 82 combined with the inner wall of the second cylinder body upper chamber 811 is provided with a third seal ring 821, the third seal ring 821 and the inner chamber of the second cylinder body upper chamber 811 are sealed and in clearance fit; the inner wall of the second cylinder body lower chamber 812 is provided with a fourth seal ring 8124 and a fifth seal ring 8125 in sequence from top to bottom; One end (the head end) of the second piston rod 83 is fixedly connected with the second piston 82 through the through hole formed on the fourth seal ring 8124, the second piston rod 83 and the fourth seal ring 8124 are sealed and in clearance fit, and the other end (the tail end) passes through the through hole formed on the fifth seal ring 8125, the second piston rod 83 and the fifth seal ring 8125 are sealed and in clearance fit.

It can be understood that, in this implementation, the fourth seal ring 8124 divides the second cylinder body 81 into the second cylinder body upper chamber 811 and the second cylinder body lower chamber 812.

When the first adapting piece 02 is manually rotated to switch the antenna 03 between the vertically placed state and the horizontally placed state, the second adapting piece 06 drives the step-type connecting shaft 07 to rotate, thereby driving the connecting rod of the non-metallic position sensor 08 to telescopically move, which can reach state 1 (as shown in FIG. 7) or state 2 (as shown in FIG. 8), the telescopic movement causes conduction of different air holes, which forms a first or second air pressure signal, and triggers a micro-switch of the external gas-electric conversion device, the external gas-electric conversion device converts the first or second air pressure signal into a first or second electric signal, so that when the external control device receives the first or second electric signal, the external control device can judge, detect or show that the antenna is vertically placed or horizontally placed.

It can be understood that, the terms "up" and "down" in the present disclosure do not represent an absolute space.

It should be noted that, in order to reduce the interference of the antenna mount itself to the test, the non-metallic cylinder 01, the first adapting piece 02, the antenna 03, the column and elevating seat of the antenna mount 04, the connecting arm 05, the second adapting piece 06, the first non-metallic sensor 08, the step-type connecting shaft 07, and the connecting parts between these components in the implementation of the present disclosure are all made of non-metallic materials.

Embodiment Four a Rotary Angle Adjustable Antenna System

A rotary angle adjustable antenna system 003 provided by the fourth embodiment of the present disclosure comprises a rotary angle adjustable antenna device 001 of the second embodiment of the present disclosure, wherein the system further comprises a first gas delivery device connected with the non-metallic cylinder 01, a gas delivery control device connected with the first gas delivery device, and the gas delivery control device is configured to: send a first gas delivery instruction or a second gas delivery instruction to the first gas delivery device; the first gas delivery device is configured to: when receiving the first gas delivery instruction sent by the gas delivery control device, supply gas to the first through hole 113 of the non-metallic cylinder 06, so that the first piston rod 14 advances toward the second through hole 114; and when receiving the second gas delivery instruction sent by the gas delivery control device, supply gas to the second through hole 114 of the non-metallic cylinder 06, so that the first piston rod 14 advances toward the first through hole 113. It can be understood that, the first piston rod 14 of the non-metallic cylinder 01 can drive the rotary sleeve to rotate in the range of 0-90° when telescopically moving back and forth, and then drives the antenna to rotate in the range of 0-90°. Furthermore, the gas delivery control device is configured to control the direction and volume of air flow of the first through hole or the second through hole of the non-metallic cylinder, thereby control the direction and speed of telescopic movement of the first piston and the first piston rod of the non-metallic cylinder.

Embodiment Five a Rotary Angle Adjustable Antenna System

Figure 9:
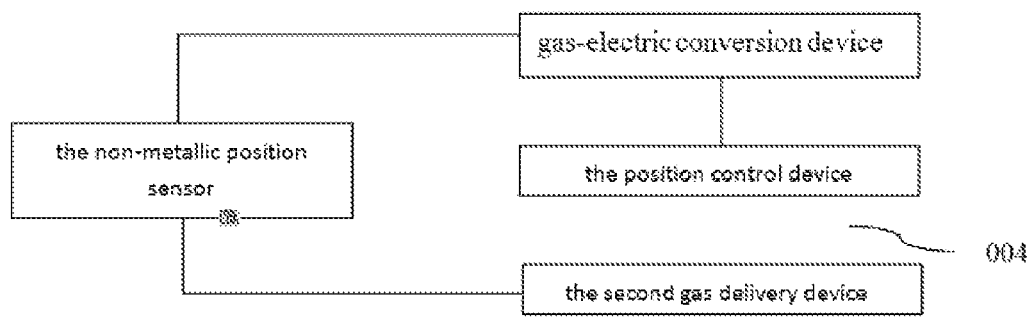
FIG. 9 is a schematic structural diagram illustrating a rotary angle adjustable antenna system 004 according to an embodiment of the present disclosure.

FIG. 9 is a schematic structural diagram illustrating a rotary angle adjustable antenna system 004 according to the fifth embodiment of the present disclosure.

As shown in FIG. 8, the rotary angle adjustable antenna system 004 provided by the present disclosure comprises a rotary angle adjustable antenna device 002 provide by the third embodiment of the present disclosure, a gas-electric conversion device connected with the non-metallic position sensor 08, and a position control device connected with the gas-electric conversion device;

when different air holes on the cylinder of the non-metallic position sensor 08 communicate with each other, the non-metallic position sensor 08 sends a first or second air pressure signal to the gas-electric conversion device; the gas-electric conversion device is configured to convert the received first or second air pressure signal into a first or second electric signal; the position control device is configured to: when receiving the first or second electric signal, determine that the antenna is placed vertically or horizontally.

Optionally, since the position control device can determine the antenna is placed horizontally or vertically, the position control device can further be the preset by a control program of the position control device of the present disclosure. For example, when the position control device determines that the antenna is in a horizontally placed state, the control program of the position control device is preset not to output an instruction for controlling the antenna to move in a certain direction, thereby avoiding the antenna to move invalidly.

Specifically, the rotary angle adjustable antenna system 004 provided by the present disclosure further comprises a second gas delivery device, the second gas delivery device is configured to supply gas to the cylinder of the non-metallic position sensor 08, specifically, the gas delivery device provided by the present disclosure is configured to supply gas to the air inlet hole of the first radial air hole 821, the second radial air hole 822, and the third radial air hole 823 of the second non-metallic position sensor 08.

The present disclosure may also have other implementations, any technical solution formed by equivalent replacement or equivalent transformation falls within the scope of the present disclosure.

What is claimed is:

1. A rotary angle adjustable antenna device, comprising a non-metallic cylinder for electromagnetic compatibility testing, a first adapting piece, and an antenna; wherein, the first adapting piece comprises: a hollow cavity, an empty slot arranged inside the cavity, a first mounting hole arranged inside the cavity and penetrating upper and lower surfaces of the adapting piece, and a second mounting hole communicated with the empty slot;

the antenna being mounted in the first mounting hole with a rotary sleeve arranged outside, at least one end of the antenna extending out of the first mounting hole;

the non-metallic cylinder for electromagnetic compatibility testing comprising: a first cylinder body, an end cover, a first piston placed in the first cylinder body and dividing the first cylinder body into a first chamber and a second chamber, a first through hole provided on the wall of the first cylinder body and communicating with the first chamber, a second through hole provided on the wall of the first cylinder body and communicating with the second chamber, and a first piston rod; wherein, a first end of the first piston rod is fixedly connected with the first piston, a second end of the piston rod passes through a third through hole formed on the end cover and exposes outside the first cylinder body;

the first adapting piece being further provided with a second mounting hole, the first piston rod of the non-metallic cylinder being placed in the empty slot of the first adapting piece after passing through the end cover of the non-metallic cylinder then passing through the second mounting hole of the first adapting piece; the first piston rod being connected with the rotary sleeve, wherein the first piston rod can drive the rotary sleeve to rotate in the range of 0-90° when telescopically moving back and forth along the empty slot, and then driving the antenna to rotate in the range of 0-90°.

2. The rotary angle adjustable antenna device of claim 1, wherein the first through hole and the second through hole of the non-metallic cylinder are respectively connected to an air pressure control device through a pipeline, the air pressure control device being configured to control the direction and volume of air flow of the first through hole and/or the second through hole, thereby controlling the direction and speed of telescopic movement of the first piston rod of the non-metallic cylinder.

3. The rotary angle adjustable antenna device of claim 1, wherein a first annular sealing element is provided at a portion where the first piston of the non-metallic cylinder is coupled with the first cylinder body; a second annular sealing element being provided at a portion where the first cylinder body is coupled with the first piston rod; and a third annular sealing element being provided at a portion where the end cover is coupled with the piston rod.

4. The rotary angle adjustable antenna device of claim 1, wherein one side of the first adapting piece with the second mounting hole is provided with a mounting screw hole, the end cover of the non-metallic cylinder being provided with a matching mounting screw hole, and the end cover of the non-metallic cylinder being screw joint with the side of the first adapting piece with the second mounting hole through a screw.

5. The rotary angle adjustable antenna device of claim 1, wherein the rotary angle adjustable antenna device further comprises an antenna mount, a connecting arm connected to the antenna mount, a second adapting piece fixedly connected to the connecting arm, and a non-metallic position sensor fixedly connected to the connecting arm; wherein, the first adapting piece is movably connected on the second adapting piece; the first adapting piece and the second adapting piece being connected through a step-type connecting shaft, and the step-type connecting shaft being further connected with the non-metallic position sensor.

6. The rotary angle adjustable antenna device of claim 5, wherein the step-type connecting shaft being further connected with the non-metallic position sensor comprises: the non-metallic position sensor comprising a second cylinder body, a second piston and a second piston rod placed in the second cylinder body, one end of the second piston being fixedly connected with the second piston rod, another end of the second piston being fixedly connected with a connecting rod; wherein the step-type connecting shaft drives the connecting rod of the non-metallic position sensor to perform telescopic movement through a transmission connecting part.

7. A rotary angle adjustable antenna system, comprising a rotary angle adjustable antenna device of claim 1, wherein the system further comprises a first gas delivery device connected with the non-metallic cylinder of the rotary angle adjustable antenna device, a gas delivery control device connected with the first gas delivery device, and the gas delivery control device being configured to: send a first gas delivery instruction or a second gas delivery instruction to the first gas delivery device; the first gas delivery device being configured to: when receiving the first gas delivery instruction sent by the gas delivery control device, supply gas to the first through hole of the non-metallic cylinder, so that the first piston rod advancing toward the second through hole; and when receiving the second gas delivery instruction sent by the gas delivery control device, supply gas to the second through hole of the non-metallic cylinder, so that the first piston rod advancing toward the first through hole.

8. The rotary angle adjustable antenna system of claim 7, wherein the gas delivery control device is further configured to control the direction and volume of air flow supplied by the first gas delivery device to the first through hole and/or the second through hole of the non-metallic cylinder, thereby controlling the direction and speed of telescopic movement of the first piston rod of the non-metallic cylinder.

* * * * *